(12) United States Patent
Nagao et al.

(10) Patent No.: US 8,663,484 B2
(45) Date of Patent: *Mar. 4, 2014

(54) METHOD FOR MANUFACTURING A PRINTED CIRCUIT BOARD AND A PRINTED CIRCUIT BOARD OBTAINED BY THE MANUFACTURING METHOD

(75) Inventors: Harumi Nagao, Ichikawa (JP); Yoshiyuki Asakawa, Ichikawa (JP)

(73) Assignee: Sumitomo Metal Mining Co., Ltd. (JP)

( * ) Notice: Subject to any disclaimer, the term of this patent is extended or adjusted under 35 U.S.C. 154(b) by 446 days.

This patent is subject to a terminal disclaimer.

(21) Appl. No.: 12/452,479

(22) PCT Filed: Jun. 23, 2008

(86) PCT No.: PCT/JP2008/061791
§ 371 (c)(1),
(2), (4) Date: Jan. 4, 2010

(87) PCT Pub. No.: WO2009/008273
PCT Pub. Date: Jan. 15, 2009

(65) Prior Publication Data
US 2010/0126762 A1    May 27, 2010

(30) Foreign Application Priority Data

Jul. 9, 2007   (JP) .................... 2007-180159
Sep. 10, 2007  (JP) .................... 2007-234781

(51) Int. Cl.
*H01B 13/00*   (2006.01)

(52) U.S. Cl.
USPC ............. 216/13; 216/37; 216/44; 216/67; 428/458; 428/626; 228/122.1

(58) Field of Classification Search
USPC ............. 216/37, 44, 67, 13, 7, 673; 428/458, 428/626; 228/122.1
See application file for complete search history.

(56) References Cited

U.S. PATENT DOCUMENTS

| | | | |
|---|---|---|---|
| 4,601,783 A * | 7/1986 | Krulik | 216/83 |
| 4,806,395 A * | 2/1989 | Walsh | 427/444 |
| 5,800,650 A * | 9/1998 | Anderson et al. | 156/150 |
| 2004/0262367 A1* | 12/2004 | Nakamura | 228/122.1 |
| 2005/0266165 A1 | 12/2005 | Mobius et al. | |

FOREIGN PATENT DOCUMENTS

| | | |
|---|---|---|
| JP | 61250200 | 11/1986 |
| JP | 6-120630 | 4/1994 |
| JP | 6-132628 | 5/1994 |
| JP | 8-116159 | 5/1996 |

(Continued)

*Primary Examiner* — Nadine Norton
*Assistant Examiner* — Maki Angadi
(74) *Attorney, Agent, or Firm* — Gerald E. Hespos; Michael J. Porco; Matthew T. Hespos

(57) ABSTRACT

A method for manufacturing a printed circuit board enables a metal residue between wirings to be removed inexpensively without side etching of a copper layer while having sufficient insulation reliability for micro wiring working. The method includes forming a base metal layer directly at least on one face of an insulator film without an adhesive, and a copper coat layer formed on the base metal layer to form adhesiveless copper clad laminates, then forming a pattern on the adhesiveless copper clad laminates by an etching method. The etching method includes a process of etching treatment for the adhesiveless copper clad laminates with an iron (III) chloride solution or a copper (II) chloride solution containing hydrochloric acid and then, a process of treatment with an acid oxidant containing potassium permanganate.

7 Claims, 1 Drawing Sheet
(1 of 1 Drawing Sheet(s) Filed in Color)

| | Composition (% by weight) | Dissolution of Ni-Cr alloy sputtering film | Dissolution of Cu sputtering film |
|---|---|---|---|
| Example 1 | Potassium permanganate: 1<br>Hydrochloric acid: 0.3<br>Ion exchange water: the rest | Good, dissolved | Good, not dissolved |
| Comparative Example 1 | Potassium permanganate: 1<br>Ion exchange water: the rest | Poor, not dissolved | Good, not dissolved |
| Comparative Example 3 | Potassium permanganate: 1<br>Hydrochloric acid: 0.001<br>Ion exchange water: the rest | Poor, not dissolved | Good, not dissolved |
| Comparative Example 4 | Potassium permanganate: 1<br>Hydrochloric acid: 5<br>Ion exchange water: the rest | Good, dissolved | Poor, dissolved |

(56) References Cited

FOREIGN PATENT DOCUMENTS

| JP | 8-139448 | 5/1996 |
| JP | 2003188495 | 7/2003 |
| JP | 2005-23340 | 1/2005 |

* cited by examiner

FIG.1

| | Composition (% by weight) | Dissolution of Ni-Cr alloy sputtering film | Dissolution of Cu sputtering film |
|---|---|---|---|
| Example 1 | Potassium permanganate: 1<br>Hydrochloric acid: 0.3<br>Ion exchange water: the rest | Good, dissolved | Good, not dissolved |
| Comparative Example 1 | Potassium permanganate: 1<br>Ion exchange water: the rest | Poor, not dissolved | Good, not dissolved |
| Comparative Example 3 | Potassium permanganate: 1<br>Hydrochloric acid: 0.001<br>Ion exchange water: the rest | Poor, not dissolved | Good, not dissolved |
| Comparative Example 4 | Potassium permanganate: 1<br>Hydrochloric acid: 5<br>Ion exchange water: the rest | Good, dissolved | Poor, dissolved |

FIG.2

| | Composition of alloy sputter film | Before etching | After etching |
|---|---|---|---|
| Example 9 | Ni-40%Cr | | |
| Example 11 | Ni-4%Cr-20%Mo | | |
| Example 14 | Ni-16.5%Cr-17%Mo-5%Fe-4.5%W | | |
| Example 17 | Ni-7%Ti | | |

METHOD FOR MANUFACTURING A PRINTED CIRCUIT BOARD AND A PRINTED CIRCUIT BOARD OBTAINED BY THE MANUFACTURING METHOD

BACKGROUND OF THE INVENTION

1. Field of the Invention

The present invention relates to a method for manufacturing a printed circuit board to become a material of an electronic component such as a TAB tape, COF tape and the like, and relates to a printed circuit board obtained by the manufacturing method. More particularly, it relates to a manufacturing method of a printed circuit board in which metal residue between wirings can be removed without side etching of a copper layer in an inexpensive and simple process by applying predetermined etching to adhesiveless copper clad laminates, and a pattern having sufficient insulation reliability can be formed in a micro wiring working, and relates to a printed circuit board obtained by the manufacturing method.

2. Description of the Related Art

In general, circuit boards used for manufacturing a flexible circuit board are roughly classified into adhesive copper clad laminates in which a copper foil to become a conductor layer is bonded onto an insulator film using an adhesive (See Japanese Patent Laid-Open No. H6-132628, for example) and adhesiveless copper clad laminates in which a copper coat layer to become a conductor layer is directly formed on the insulator film by a dry plating method or a wet plating method without using an adhesive.

With the recent trend of high-density electronic equipment, a circuit board having a wiring width set with a narrow pitch has been in demand, and in this case, in manufacturing the adhesive copper clad laminates, when a circuit board is to be manufactured by forming a wiring portion through etching according to a desired wiring pattern on a copper coat layer formed on an insulator film as a board, there is a problem that since etching on a side face of the wiring portion, which is so-called side-etching, is caused, a sectional shape of the wiring portion can be a splay-out trapezoid easily.

Therefore, in order to satisfy such a demand, the adhesiveless copper clad laminates has become a main stream at present instead of the prior-art bonded copper foil (adhesive copper clad laminates).

In order to manufacture the adhesiveless copper clad laminates, an electric copper-plating method is employed as means for forming a copper coat layer with a uniform thickness on an insulator film. In order to carry out the electric copper plating, conductivity is given to the whole surface by forming a metal layer of a thin film on the insulator film on which the electric copper plating coat is to be applied and the electric copper plating processing is applied thereon in general (See Japanese Patent Laid-Open No. H8-139448, for example). Also, in order to obtain the thin-film metal layer on the insulator film, dry plating methods including vacuum deposition, ion plating and the like are used in general.

In the above, adhesion between the insulator film and the copper coat layer is extremely weak since a fragile layer such as $CuO$, $Cu_2O$ and the like is formed on their interface, and in order to maintain adhesion strength with the copper layer required for the printed circuit board, a Ni—Cr alloy layer is provided as a base metal layer between the insulator film and the copper coat layer (See Japanese Patent Laid-Open No. H6-120630).

Here, in order to form a wiring pattern on a two-layer plated circuit board with a subtractive method, an iron (III) chloride solution in which iron (III) chloride ($FeCl_3$) is dissolved in water or copper (II) chloride solution in which copper (II) chloride ($CuCl_2 \cdot 2H_2O$) is dissolved in water and an appropriate amount of hydrochloric acid is added is used as an etching liquid for conducting etching, for example. In the etching method using these etching liquids, sufficient etching effects can not be obtained in some cases since etching of the base metal layer such as Ni—Cr alloy and the like remains between wirings.

Moreover, in the recent flexible circuit boards, a pitch of the wirings becomes narrower with the trend of higher-density of the wiring pattern, and use under a high voltage has been required with higher functionalities. As a result, the insulation reliability has become more important in the printed circuit board in use, and as an index of this characteristic, a high-temperature high-humidity bias test (HHBT) and the like are conducted.

However, if the etching residue of the base metal layer such as Ni—Cr alloy and the like has been caused when etching of the two-layer plated circuit board is carried out using the above etching liquid, the high-temperature high-humidity bias test (HHBT) might shorten the adjacent copper wirings due to the etching residue of the Ni—Cr alloy layer, which prevents realization of a high insulation resistance and causes defective, which is a problem.

Thus, as one of means for realizing the insulation reliability, the above-mentioned remaining base metal component between wirings needs to be removed.

In order to correct such a trouble, in Japanese Patent Laid-Open No. 2005-23340, for example, dissolution of the etching residue of the Ni—Cr alloy by treatment using one or two types or more of acid etching liquid containing hydrochloric acid and alkali etching liquids such as potassium permanganate solution and the like after treatment with the iron (III) chloride solution or copper (II) chloride solution containing hydrochloric acid. In this case, the etching residue of Ni—Cr alloy can be removed by a method with less side-etching of the copper wiring.

SUMMARY OF INVENTION

However, in the case of treatment with acid etching liquid containing hydrochloric acid used after the wiring has been formed with the iron (III) chloride solution or copper (II) chloride, it is difficult to completely remove Cr, and since the etching liquid contains hydrochloric acid of approximately 10 to 20% by weight, which would dissolve copper if used as it is, an inhibitor to inhibit dissolution of copper should be contained by a certain amount. Thus, dissolution concentration of copper and inhibitor concentration need to be managed on a daily basis.

Though treatment with the alkali etching liquid such as permanganate solution and the like is effective in removing Cr, but use of the etching liquid requires treatment facilities exclusive for alkali, and it is difficult to increase processes. Also, since the liquid is a strong alkaline solution and there is a good possibility that the dissolved Cr is turned into a hexavalent Cr form, which is toxic, sufficient attention and cost should be taken for disposal.

The present invention has an object to provide a manufacturing method of a printed circuit board that can solve the above prior-art problems in the manufacture of the adhesiveless copper clad laminates, remove the metal residue between wirings without side-etching of a copper layer in an inexpensive and simple process and has sufficient insulation reliability even for a micro wiring work and a printed circuit board obtained by the manufacturing method.

The inventors have keenly examined the etching treatment liquid in order to solve the above problems and as a result, paid attention to an acid permanganate solution which is acid and has an effect to dissolve copper but had not been used as the etching liquid, for which an effect to dissolve a metal component as the base metal layer had not been found. Then, the inventor found out that addition of an extremely small amount of acid such as hydrochloric acid to the permanganate solution has an effect to dissolve the base metal layer component while dissolution of copper is restrained and completed the present invention.

That is, a first invention of the present invention is a method for manufacturing a printed circuit board, comprising: forming a base metal layer directly at least on one surface of an insulator film without an adhesive, and a copper coat layer on the base metal layer to form adhesiveless copper clad laminates, and forming a pattern on the adhesiveless copper clad laminates by an etching method, characterized in that the etching method includes a process of etching treatment for the adhesiveless copper clad laminates with an iron (III) chloride solution or a copper (II) chloride solution containing hydrochloric acid, and a process of treatment with an acid oxidant containing permanganate.

A second invention of the present invention is a method for manufacturing a printed circuit board described in the first invention, characterized in that after the treatment process by the acid oxidant, a process of removing a manganese compound by a manganese residue remover is added.

A third invention of the present invention is a method for manufacturing a printed circuit board described in the first or second invention of the present invention, characterized in that the base metal layer is comprised of at least one type of metal or an alloy made up of two types or more, respectively selected from the group consisting of Ni, Cu, Mo, Ta, Ti, V, Cr, Fe, Co, and W.

Moreover, a fourth invention of the present invention is a method for manufacturing a printed circuit board described in the first or second invention of the present invention, characterized in that the oxidant is a solution containing a permanganate ratio of 0.01 to 10% by weight and a hydrochloric acid ratio of 0.005 to 2% by weight.

A fifth invention of the present invention is a method for manufacturing a printed circuit board described in the first invention of the present invention, characterized in that the insulator film is a resin film of at least one type or more, selected from the group consisting of polyimide film, polyamide film, polyester film, polytetrafluoroethylene film, polyphenylenesulfide film, polyethylenenaphthalate film, and liquid crystal polymer film.

Moreover, a sixth invention of the present invention is an etching liquid used for the method for manufacturing the printed circuit board described in claim 1, characterized in that the oxidant contains permanganate of 0.01 to 10% by weight and hydrochloric acid of 0.005 to 2% by weight.

Moreover, a seventh invention of the present invention is a printed circuit board obtained by the method for manufacturing the printed circuit board described in any one of the first to fifth inventions.

According to the method for manufacturing a printed circuit board according to the present invention, by employing the etching method of the present invention, metal residues between wirings can be removed without side-etching of a copper layer in an inexpensive and simple process and also, a micro wiring with high insulation reliability can be obtained for the adhesiveless copper clad laminates, and the industrial advantages thereof is extremely great.

BRIEF DESCRIPTION OF THE DRAWINGS

The file of this patent contains at least one drawing executed in color. Copies of this patent with color drawings will be provided by the Patent and Trademark Office upon request and payment of the necessary fee.

FIG. 1 is an appearance view illustrating a degree of dissolution of a Ni—Cr alloy sputtering film and a Cu sputtering film of a part of Examples and Comparative Examples.

FIG. 2 is an appearance view illustrating a degree of dissolution before and after etching of an alloy sputtering film for a part of Examples.

DETAILED DESCRIPTION OF THE PREFERRED EMBODIMENTS

In manufacturing the adhesiveless copper clad laminates, the insulator film is applied with hydrazine processing or plasma processing so as to alter and activate a surface of the insulator film and to ensure bonding with the base metal layer in some cases. It is considered that since the bonding force obtained by this treatment is strong, a peel strength that can withstand practical use is exerted as the adhesiveless copper clad laminates.

However, after the pattern is formed by etching, an extremely fine amount of a metal component of the base metal layer directly bonded to the insulator film is considered to remain on a surface layer portion of the insulator film in a space portion between leads even if the film is passed through etching or the subsequent cleaning process.

The inventors estimate that the metal component remaining on the surface layer is one of factors causing migration when the high-temperature high-humidity bias test (HHBT) is conducted.

The present invention will be described below in detail.

The present invention is characterized in that, in a method for manufacturing a printed circuit board in which on adhesiveless copper clad laminates having a base metal layer directly formed at least on one face of an insulator film without an adhesive and a copper coat layer formed on the base metal layer, a pattern is formed by an etching method, a process of etching treatment for the adhesiveless copper clad laminates with an iron (III) chloride solution or a copper (II) chloride solution containing hydrochloric acid and a subsequent process of treatment of the obtained adhesiveless copper clad laminates with an acid etching liquid containing permanganate are provided.

That is, in the case of the prior-art treatment with the acid etching liquid of the iron (III) chloride solution or the copper (II) chloride containing hydrochloric acid used after the wiring is formed, it is difficult to completely remove Cr and also, since the etching liquid contains approximately 10 to 20% by weight of hydrochloric acid, which would dissolve copper if used as it is, an inhibitor to inhibit dissolution of copper should be contained by a certain amount. Also, treatment with an alkali etching liquid such as permanganate solution and the like is effective in removal of Cr, but use of the etching liquid requires treatment facilities exclusive for alkali, and it is difficult to increase processes. In order to solve the above problems, in a manufacturing method of a printed circuit board in which on adhesiveless copper clad laminates having a base metal layer directly formed at least on one face of an insulator film without an adhesive and a copper coat layer formed on the base metal layer, a pattern is formed by an etching method, a method is provided of washing and treating the etching surface by an acid oxidant containing permanganate after the etching treatment by the iron (III) chloride solution or the copper (II) chloride solution containing hydrochloric acid.

1) Adhesiveless Copper Clad Laminates a) Insulator Film

An insulator film used as an insulating board material in the present invention is preferably at least one type or more of a thermosetting resin film selected from the group consisting of polyimide film, polyamide film, polyester film, polytetrafluoroethylene film, polyphenylenesulfide film, polyethylenenaphthalate film, and liquid crystal polymer film from the viewpoint of heat resistance. Among them, the polyimide film and the polyamide film are particularly preferable films in a point that they are suitable for applications requiring high-temperature connection in a solder reflow and the like.

Also, the insulator film with a film thickness of 8 to 75 μm can be used suitably. In order to reduce heat expansion rate and the like, inorganic materials such as glass fiber, CNT and the like may be added into the resin film as appropriate.

b) Base Metal Layer

As the material of the base metal layer formed on the insulator film, at least one type of metal or an alloy of two types or more, selected from the group consisting of Ni, Cu, Mo, Ta, Ti, V, Cr, Fe, Co, and W is preferable since it has high corrosion resistance, high adhesion and heat resistance.

Also, on the base metal layer, a metal oxide of the base metal layer may be laminated.

Moreover, the film thickness of the base metal layer on the printed circuit board of the present invention is preferably 3 to 50 nm.

If the base metal layer is thinner than 3 nm, the etching liquid would penetrate in wiring working and a wiring portion would float and the like, which causes a problem such as extreme drop in the wiring peel strength and is not preferable. If the film thickness is thicker than 50 nm, etching becomes difficult, which is not preferable, either.

c) Copper Coat Layer

A copper coat layer is formed using a sputtering device having a copper target attached on a cathode for sputtering. At this time, the base metal layer and the copper coat layer are preferably formed in the same vacuum chamber continuously. If the film is taken out into the atmosphere after the base metal layer is formed and the copper coat layer is formed using another sputtering device, sufficient dehydration should be given before film formation.

Also, if the copper coat layer is formed by a dry plating method and then, a copper layer is formed by a wet plating method on the copper coat layer, electroless copper plating is applied, for example. This plating is carried out because, even in the case of an insulator film with a large pinhole, a film exposed face is covered so as to make the whole surface of the board face into a good conductor by forming the electroless plated copper layer on the whole surface of the board so as to prevent an influence by the pinhole. The layer thickness of the plated copper layer by the electroless copper plating liquid is only necessary such that a defect by the pinhole on the board face can be fixed and the layer is not dissolved by the electric copper plating liquid during the electric copper plating and is preferably in a range of 0.01 to 1.0 μm.

As the dry plating method, methods such as resistance heating deposition, ion plating deposition, sputtering deposition and the like may be used. It is possible to form the copper coat layer only by the dry plating method, but to laminate and to form the copper coat layer by the wet plating method further on the copper coat layer after the formation of the copper layer by the dry plating method is preferable for forming a relatively thick film.

In the printed circuit board of the present invention, too, a copper coat layer formed on the base metal layer can be formed as the copper coat layer formed by the dry plating method and the copper coat layer laminated and formed by the wet plating method on the copper coat layer. The film thickness of the copper coat layer in which the copper coat layer formed by the dry plating method and the copper coat layer laminated and formed by the wet plating method on the copper coat layer is preferably 10 nm to 35 μm. If the thickness is thinner than 10 nm, the copper coat layer formed by the dry plating method becomes thin, and power supply becomes difficult in the subsequent wet plating process, which is not preferable. On the other hand, if the thickness is thicker than 35 μm, productivity is lowered, which is not preferable, either.

2) Method for Manufacturing a Printed Circuit Board

A method for a manufacturing a printed circuit board of the present invention will be described below in detail.

In the present invention, at least on one face of an insulator film, which is a commercial thermosetting film selected from the group consisting of polyimide film, polyamide film, polyester film, polytetrafluoroethylene film, polyphenylenesulfide film, polyethylenenaphthalate film, and liquid crystal polymer film, a base metal layer is directly formed without an adhesive, and a copper coat layer with a desired thickness is further formed on the base metal layer.

a) Dehydration Treatment

The insulator film usually contains water, and it is necessary to remove water present in the film by air drying and/or vacuum drying before the base metal layer is formed by the dry plating method. If drying is not sufficient, adhesion with the base metal layer becomes poor.

It is possible to modify the insulator film surface after the drying. As a method of forming the modified layer, chemical treatment by chemicals or physical treatment such as plasma treatment, corona discharge, ultraviolet irradiation and the like can be employed, but the method is not limited to anyone of them.

b) Formation of the Base Metal Layer

When the base metal layer is to be formed by the dry plating method or when the base metal layer is to be formed using a winding-type sputtering device, for example, an alloy target having a composition of the base metal layer is attached to a cathode for sputtering. Specifically, after the sputtering device having a film set is vacuumed and exhausted, Ar gas is introduced, the inside of the device is maintained at approximately 1.3 Pa, and while the insulator film attached on a winding/unwinding roll in the device is fed at a speed of approximately 3 m/minute, electricity is supplied from a direct current power supply for sputtering connected to the cathode so as to start sputtering discharge, and the base metal layer is continuously formed on the film. The base metal layer with the desired film thickness is formed on the film by this film forming.

c) Formation of the Copper Coat Layer

Similarly, using the sputtering device with the copper target attached on the cathode for sputtering, the copper coat layer can be formed by the dry plating method. At this time, the base metal layer and the copper coat layer are preferably formed continuously in the same vacuum chamber.

Also, if the copper coat layer is to be further formed on the copper coat layer by the wet plating method, there are a case conducted only by the electric copper plating and a case conducted in combination with the wet plating method of electroless copper plating as primary plating and electrolytic copper plating and the like as secondary plating.

Here, the electroless copper plating is conducted as the primary plating because if the dry plating is conducted through deposition, a large pinhole might be formed, and the resin film might be exposed on the surface. Thus, by forming the electroless copper plating coat layer on the whole surface of the board, the film exposed face is covered and the whole surface of the board face is made into a good conductor, by which an influence of the pinhole is avoided.

The electroless plating liquid used in the electroless plating may be any as long as a metal ion contained therein has autocatalytic properties and the liquid is of a reduction precipitation type in which the liquid is reduced by a reducing agent such as hydrazine, sodium phosphinic acid, formalin and the like and metal is precipitated, but in view of the gist of the present invention, the purpose of which is of making a good conductor from an exposed portion of the insulator film exposed by the pinhole caused in the base metal layer, an electroless copper plating liquid with favorable conductivity and relatively good workability is optimal.

A thickness of a copper plating coat layer by the electroless copper plating as the primary plating may be the thickness of such a degree that a defect by a pinhole on the board face can be fixed and the layer is not dissolved by the electric copper plating liquid when the electric copper plating is applied as the secondary plating, which will be described later, and is preferably in a range of 0.01 to 1.0 µm.

Subsequently, the electric copper plating is applied as the secondary plating on the electroless copper plating coat layer in order to form the copper coat layer with a desired thickness.

According to the copper coat layer formed on the base metal layer as above, a favorable printed circuit board with high adhesion degree of the conductor layer, which is not affected by pinholes with various sizes caused in formation of the base metal layer, can be obtained.

As the wet copper plating conducted in the present invention, conditions in a wet copper plating method of an ordinary method can be employed both for the primary and the secondary.

3) Formation of Wiring Pattern

Using the adhesiveless copper clad laminates according to the present invention as above, a printed circuit board is obtained by individually forming a wiring pattern at least on one face of the adhesiveless copper clad laminates. Alternatively, a via hole for inter-layer connection may be formed at a predetermined position to be used for various applications.

More specifically, there are methods as follows:

(a) A high-density wiring pattern is individually formed at least on one face of a flexible sheet;

(b) A via hole penetrating the wiring layer and the flexible sheet is formed on the flexible sheet on which the wiring layer is formed; and (c) Depending on the case, a conductive substance is filled in the via hole so as to make inside the hole conductive.

As the method of forming a wiring pattern, prior-art known methods such as photo etching and the like can be used, and for example, the adhesiveless copper clad laminates in which the base metal layer and the copper coat layer are formed at least on one face is prepared, screen printing is applied or a dry film is laminated on the copper and a photosensitive resist film is formed and then, patterning is made by exposure and development.

Then, after the metal foil is selectively removed by etching liquid, the resist is removed so as to form a predetermined wiring pattern.

Specifically, (A) the adhesiveless copper clad laminates are applied with etching treatment by an iron (III) chloride solution or a copper (II) chloride solution containing hydrochloric acid.

After that, it is necessary to treat the obtained adhesiveless copper clad laminates (B) with an acid oxidant containing permanganate. The acid oxidant containing permanganate is preferably a solution containing a permanganate ratio of 0.01 to 10% by weight and a hydrochloric acid ratio of 0.005 to 2% by weight. If the permanganate concentration is low, etching time is slowed, while the effect is not changed by a high concentration. Thus, the permanganate concentration is preferably 0.1 to 5% by weight. Also, if the hydrochloric acid concentration is high, a copper wiring might become easily dissolved, while with a low concentration, an etching speed is slow and the etching time is increased. Thus, the hydrochloric acid concentration is more preferably 0.01 to 0.5% by weight.

The treatment method may be any of a spraying method, immersion method and the like. A treatment temperature of the acid etching liquid is preferably 20 to 60° C., but if the temperature is low, removal of a passive layer is likely to become insufficient and the etching time gets longer. If the temperature is high, generation of hydrochloric acid mist is increased and a dissolution amount of copper is also increased. Thus, the temperature is more preferably 30 to 50° C. The treatment time of the permanganate etching liquid containing hydrochloric acid is preferably 30 seconds to 3 minutes. If the time is shorter than 30 seconds, it is insufficient to remove undissolved residue of the base metal layer, while if the time is longer than 3 minutes, a copper dissolved amount is increased.

After the treatment with the acid oxidant containing permanganate, manganese might adhere to an etching face and form a metal compound such as an oxide depending on the conditions. In order to remove this, treatment with an organic acid aqueous solution such as oxalic acid, ascorbic acid and the like having reducing character and a commercial manganese residue remover used for removing the manganese residue of an alkali permanganate etching liquid is preferable.

If the residue caused by the base metal layer between the wiring can not be fully removed after the manganese compound is removed by the manganese residue remover, treatment is preferably executed again with the acid oxidant containing permanganate. The residue caused by the base metal layer between the wirings can be removed more sufficiently by conducting the treatment with the acid oxidant containing permanganate twice or three times with the treatment using the remover between the treatments.

Use of only permanganate solution does not have an effect to dissolve Ni—Cr and use of only hydrochloric acid has a weak effect of dissolution.

However, with the oxidant containing permanganate and a small amount of hydrochloric acid, chlorine is generated in a reaction between permanganate and hydrochloric acid, and this containment of chlorine in the oxidant containing permanganate and a small amount of hydrochloric acid is considered to influence the dissolution of Ni—Cr.

On the other hand, if the added acid is nitric acid, sulfuric acid and the like, copper is easily dissolved and the acid can not be used in the manufacturing method of the printed circuit board in principle. Even with a small amount of these acids, dissolution of copper is similarly recognized. However, it does not necessarily apply if an appropriate inhibitor for preventing or slowing the copper dissolution is added.

Therefore, the acid added in the present invention may only be an acid solution that dissolves Ni—Cr and remains at dissolution of copper wiring in a range not causing defective insulation (defective connection).

As mentioned above, the method has an effect to dissolve Ni—Cr only if permanganate and a small amount of hydrochloric acid are combined, and particularly it was found that the Cu dissolution speed is extremely slowed by setting the concentration of hydrochloric acid at 0.005 to 2% by weight, and this method is preferable as a method for removing metal residue remaining between the wirings in the adhesiveless copper clad laminates.

As mentioned above, by using the manufacturing method of the printed circuit board of the present invention, lead thinning caused by side etching of the copper layer does not occur, but micro wiring work is realized.

In order to further increase the density of the wiring, adhesiveless copper clad laminates having the copper coat layer formed on both faces is preferably prepared and a wiring pattern is formed on both faces of the board by pattern working on the both faces. Whether or not the entire wiring pattern should be divided into several wiring regions depends on distribution of the wiring density of the wiring pattern and the like, but the wiring pattern may be divided into a high-density wiring region with the wiring width and the wiring interval of 50 μm or less, respectively, and the other wiring region, for example, and the size of the circuit board to be divided is set at approximately 10 to 65 mm and divided as appropriate, giving consideration to thermal expansion difference with the printed circuit board and convenience in handling and the like.

As a method of forming the via hole, a prior-art known method can be used, and a via hole penetrating the wiring pattern and the flexible sheet is formed at a predetermined position of the wiring pattern by laser machining, photo-etching and the like, for example. A diameter of the via hole is preferably kept small in a range not disturbing conductivity in the hole and it is usually 100 μm or less, or more preferably 50 μm or less.

In the via hole, conductive metal such as copper is filled by plating, deposition, sputtering and the like or a conductive paste is pressed in using a mask having a predetermined opening pattern and dried, and the layers are electrically connected to each other by making inside the hole conductive. The conductive metals include copper, gold, nickel and the like.

EXAMPLES 1 TO 6, COMPARATIVE EXAMPLES 1 TO 6

The present invention will be described below in more detail referring to Examples and Comparative Examples.

A Ni—Cr alloy film in Examples 1 to 6 and Comparative Examples 1 to 6 is formed in a range of the thickness of 20 to 30 nm by using a 20% by weight Cr—Ni alloy target (by Sumitomo Metal Mining Co., Ltd.) on a polyimide film (by DuPont-Toray Co., Ltd., film thickness: 50 μm) through a direct-current sputtering method (sputtering device: by Hirano Koh-on Co., Ltd.).

Moreover, the copper film in Examples 1 to 6 and Comparative Examples 1 to 6 is formed in a range of 100 to 120 nm on a polyimide film using the direct current sputtering method.

In each of Examples and Comparative Examples, the predetermined alloy film, the metal film or the copper film is individually formed on the polyimide film in order to evaluate dissolution properties for each of the alloy film, the metal film or the copper film.

The potassium permanganate aqueous solution is produced by dissolving potassium permanganate in ion-exchange water with a composition shown in the following table (Comparative Example 1). After the potassium permanganate aqueous solution is made similarly to Comparative Example 1, an alkali permanganate solution is made by adding potassium hydroxide with a composition shown in the following table (Comparative Example 2). Moreover, after the potassium permanganate aqueous solution is made similarly to Comparative Example 1, an acid permanganate solution is made by adding hydrochloric acid with a composition shown in the following table (Comparative Examples 3 to 5 and Examples 1 to 6). For the Comparative Example 6, a commercial acid etching liquid CH-1920 (by Mec Company Ltd.) is used.

An evaluating sample of 50 mm×50 mm is cut out of a polyimide film on which the above Ni—Cr alloy film is formed, and after it is immersed in each of the etching liquids at 40° C. for 2 minutes, it is washed with water for 20 seconds. Those etched with the potassium permanganate aqueous solution, the alkali permanganate solution and the acid potassium permanganate solution are further immersed in 2%-oxalic acid aqueous solution at 40° C. for 1 minute and then, washed with water for 20 seconds. The obtained evaluating films are visually checked for a degree of dissolution of the Ni—Cr alloy film. The results are also shown in Table 1.

The degree of dissolution of the Ni—Cr alloy film is indicated as "good, dissolved" if Ni—Cr alloy is dissolved on the whole face or as "poor, not dissolved" if little change is found.

In order to quantitatively analyze a remaining metal component on the film surface indicated as "good, dissolved", each sample is dissolved by a solution made up of nitric acid of 5 ml and hydrogen peroxide of 1 ml using a microwave dissolving device. Obtained metal components in each dissolving solution are quantitatively analyzed by an induction coupled plasma ion source mass spectrometer. Remaining amounts of Ni and Cr are also shown in Table 1. If the total of the remaining amounts of Ni and Cr is not more than 130 ng/cm$^2$, it is allowable.

Also, the polyimide film on which the copper film is formed is similarly immersed in the etching liquid shown in the following Table 1 at 40° C. for 2 minutes and washed with water for 20 seconds and then, the dissolution of the copper film is visually checked.

Since it is preferable that the copper film is not dissolved, if there is little change in the copper film, it is indicated as "good, not dissolved" and if there is dissolution in the copper film, it is indicated as "poor, dissolved".

The results are also shown in the following Table 1.

Photos taken to show the state of the film after immersion in each etching liquid for Example 1 and Comparative Examples 1, 3, 4 are shown in FIG. 1. It is known that presence/absence of the dissolution can be visually observed.

In Example 1 using the etching liquid in the present invention, the Ni—Cr alloy can be rapidly dissolved, and no dissolution of copper film is recognized. On the other hand, in Comparative Examples 1, 3, though the dissolution of copper film is not recognized, the Ni—Cr alloy cannot be dissolved in either of them. In Comparative Example 4, though the dissolution of the Ni—Cr alloy is recognized, dissolution of copper is also found to progress.

TABLE 1

| | Composition (% by weight) | Dissolution of 20% by weight Cr—Ni alloy sputtering film | Remaining metal component (ng/cm$^2$) Ni | Remaining metal component (ng/cm$^2$) Cr | Dissolution of Cu sputtering film |
|---|---|---|---|---|---|
| Example 1 | Potassium permanganate: 1<br>Hydrochloric acid: 0.3<br>Ion exchange water: the rest | Good, dissolved | 1 | 11 | Good, not dissolved |
| Example 2 | Potassium permanganate: 1<br>Hydrochloric acid: 0.01<br>Ion exchange water: the rest | Good, dissolved | 25 | 54 | Good, not dissolved |
| Example 3 | Potassium permanganate: 1<br>Hydrochloric acid: 0.5<br>Ion exchange water: the rest | Good, dissolved | 1 | 14 | Good, not dissolved |
| Example 4 | Potassium permanganate: 1<br>Hydrochloric acid: 2<br>Ion exchange water: the rest | Good, dissolved | <1 | 5 | Good, not dissolved |
| Example 5 | Potassium permanganate: 10<br>Hydrochloric acid: 0.005<br>Ion exchange water: the rest | Good, dissolved | 5 | 17 | Good, not dissolved |
| Example 6 | Potassium permanganate: 0.01<br>Hydrochloric acid: 0.3<br>Ion exchange water: the rest | Good, dissolved | 46 | 63 | Good, not dissolved |
| Comparative Example 1 | Potassium permanganate: 1<br>Ion exchange water: the rest | Poor, not dissolved | — | — | Good, not dissolved |
| Comparative Example 2 | Potassium permanganate: 5<br>Potassium hydroxide: 5<br>Ion exchange water: the rest | Poor, not dissolved | — | — | Good, not dissolved |
| Comparative Example 3 | Potassium permanganate: 1<br>Hydrochloric acid: 0.001<br>Ion exchange water: the rest | Poor, not dissolved | — | — | Good, not dissolved |
| Comparative Example 4 | Potassium permanganate: 1<br>Hydrochloric acid: 5<br>Ion exchange water: the rest | Good, dissolved | <1 | 2 | Poor, dissolved |
| Comparative Example 5 | Potassium permanganate: 0.005<br>Hydrochloric acid: 0.3<br>Ion exchange water: the rest | Poor, not dissolved | — | — | Good, not dissolved |
| Comparative Example 6 | Acid etching liquid containing hydrochloric acid | Good, dissolved | 15 | 16 | No good, slightly dissolved |

EXAMPLE 7

A polyimide film (by DuPont-Toray Co., Ltd., film thickness: 50 μm) is cut out into the size of 12 cm×12 cm, and a 7% by weight Cr—Ni alloy metal film is formed in a range of the thickness of 20 to 30 nm on one face thereof by using a 7% by weight —Cr—Ni alloy target (by Sumitomo Metal Mining Co., Ltd.) through a direct-current sputtering method (sputtering device: by Hirano Koh-on Co., Ltd.). An evaluating sample of 50 mm×50 mm is cut out of the polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 8

With the method similar to Example 7, a 30% by weight Cr—Ni alloy metal film is formed by using a 30% by weight Cr—Ni alloy target (by Sumitomo Metal Mining Co., Ltd.) through a direct-current sputtering method. An evaluating sample of 50 mm×50 mm is cut out of the obtained polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 9

With the method similar to Example 7, a 40% by weight —Cr—Ni alloy metal film is formed by using a 40% by weight —Cr—Ni alloy target (by Sumitomo Metal Mining Co., Ltd.) through a direct-current sputtering method. An evaluating sample of 50 mm×50 mm is cut out of the obtained polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 10

With the method similar to Example 7, a 100% by weight —Cr metal film is formed by using a 100% by weight —Cr target (by Sumitomo Metal Mining Co., Ltd.) through a direct-current sputtering method. An evaluating sample of 50 mm×50 mm is cut out of the obtained polyimide film on which the obtained metal film is formed and immersed in an acid permanganate solution in which hydrochloric acid of 0.3% by weight is added to a potassium permanganate aqueous solution of 1% by weight at 40° C. for 2 minutes, and the degree of dissolution of the metal film is visually checked. The dissolution of the metal film is recognized.

EXAMPLE 11

With the method similar to Example 7, a 4% by weight Cr-20-% by weight Mo-Ni alloy metal film is formed by using a 4% by weight Cr-20% by weight Mo—Ni alloy target (by Sumitomo Metal Mining Co., Ltd.) through a direct-current sputtering method. An evaluating sample of 50 mm×50 mm is cut out of the obtained polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 12

With the method similar to Example 7, a 4% by weight V-20-% by weight Mo—Ni alloy metal film is formed by using a 4% by weight V-20% by weight Mo—Ni alloy target (by Sumitomo Metal Mining Co., Ltd.) through a direct-current sputtering method. An evaluating sample of 50 mm×50 mm is cut out of the obtained polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 13

With the method similar to Example 7, a 16.5% by weight Cr-17% by weight Mo—Ni alloy metal film is formed by using a 16.5% by weight Cr-17% by weight Mo—Ni alloy target (by Sumitomo Metal Mining Co., Ltd.) through a direct-current sputtering method. An evaluating sample of 50 mm×50 mm is cut out of the obtained polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 14

With the method similar to Example 7, a 16.5% by weight Cr-17% by weight Mo—Ni alloy metal film is formed by using a 16.5% by weight Cr-17% by weight Mo-5% by weight Fe-4.5% by weight W—Ni alloy target (by Sumitomo Metal Mining Co., Ltd.) through a direct-current sputtering method. An evaluating sample of 50 mm×50 mm is cut out of the obtained polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 15

With the method similar to Example 7, a 22% by weight Cr-6.5% by weight Mo—Ni alloy metal film is formed by using a 22% by weight Cr-6.5% by weight Mo—Ni alloy target (by Sumitomo Metal Mining Co., Ltd.) through a direct-current sputtering method. An evaluating sample of 50 mm×50 mm is cut out of the polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 16

With the method similar to Example 7, a 22% by weight Cr-6.5% by weight Mo-16% by weight Fe—Ni alloy metal film is formed by using a 22% by weight Cr-6.5% by weight Mo-16% by weight Fe—Ni alloy target (by Sumitomo Metal Mining Co., Ltd.) through a direct-current sputtering method. An evaluating sample of 50 mm×50 mm is cut out of the obtained polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

EXAMPLE 17

With the method similar to Example 7, a 7% by weight Ti—Ni alloy metal film is formed by using a 7% by weight Ti—Ni alloy target (by Sumitomo Metal Mining Co., Ltd.) through a direct-current sputtering method. An evaluating sample of 50 mm×50 mm is cut out of the polyimide film on which the obtained alloy film is formed and immersed in an acid permanganate solution in which hydrochloric acid of 0.3% by weight is added to a potassium permanganate aqueous solution of 1% by weight at 40° C. for 2 minutes, and the degree of dissolution of the alloy film is visually checked. The dissolution of the alloy film is recognized.

Photos taken to show the state of the film before and after immersion in the etching liquid for Examples 9, 11, 14, 17 are shown in FIG. 2. Dissolution of the alloy films after etching can be visually observed in any case, and the rapid dissolution of the alloy film using the etching liquid of the present invention can be recognized.

[Evaluation]

As is obvious from Table 1, in Examples 1 to 6 using the etching liquid of the present invention, the 20% by weight Cr—Ni alloy can be rapidly dissolved and no dissolution of the copper film is recognized. On the other hand, in Comparative Examples 1, 2, 3, 5, though the dissolution of the copper film is not recognized, the 20% by weight Cr—Ni alloy can not be dissolved in any case, and in Comparative Examples 4, 6, the dissolution of the 20 by weight Cr—Ni alloy is recognized, but the dissolution of the copper film also progresses, which is not favorable.

Also, in Examples 7 to 17 using the etching liquid of the present invention, the Ni—Cr alloys with different Cr contents or Cr metal can be dissolved and moreover, dissolution of hastelloy alloy with excellent chlorine resistance is recognized. Dissolution of the Ti—Ni alloy is also recognized.

Moreover, the etching liquid used in Examples 7 to 17 is the acid permanganate solution used in Example 1 and the dissolution of the copper film is not recognized.

As mentioned above, according to the manufacturing method of the printed circuit board particularly according to the present invention and particularly to the etching liquid according to the present invention, the remaining base metal layer component is rapidly dissolved after the etching treatment with the iron (III) chloride solution or copper (II) chloride solution containing hydrochloric acid of the prior-art adhesiveless copper clad laminates in an inexpensive and simple process and also, etching of copper can be restricted. Thus, a micro wiring with high insulation resistance can be easily obtained without side etching or damage and its advantages are extremely great.

The invention claimed is:

1. A method for manufacturing a printed circuit board, comprising: forming a base metal layer directly at least on one surface of an insulator film without an adhesive, and a copper coat layer on the base metal layer to form adhesiveless copper clad laminates, and then forming a pattern on the adhesiveless copper clad laminates by an etching method, characterized in that the etching method for the adhesiveless copper clad laminates includes, in order, a process of etching treatment with an iron (III) chloride solution or a copper (II) chloride solution containing hydrochloric acid, followed sequentially by a process of treatment with an acid oxidant containing permanganate.

2. The method for manufacturing a printed circuit board according to claim 1, further comprising a process of removing a manganese compound by a manganese residue remover after the treatment process by the acid oxidant.

3. The method for manufacturing a printed circuit board according to claim 2, wherein the base metal layer is comprised of at least one type of metal or an alloy made up of two types or more, respectively selected from the group consisting of Ni, Cu, Mo, Ta, Ti, V, Cr, Fe, Co, and W.

4. The method for manufacturing a printed circuit board according to claim 2, wherein the oxidant is a solution containing a permanganate ratio of 0.01 to 10% by weight and a hydrochloric acid ratio of 0.005 to 2% by weight.

5. The method for manufacturing a printed circuit board according to claim 1, wherein the insulator film is a resin film of at least one type or more, selected from the group consisting of polyimide film, polyamide film, polyester film, polytetrafluoroethylene film, polyphenylenesulfide film, polyethylenenaphthalate film, and liquid crystal polymer film.

6. An etching liquid used for the method for manufacturing the printed circuit board according to claim 1, wherein the oxidant contains a permanganate ratio of 0.01 to 10% by weight and a hydrochloric acid ratio of 0.005 to 2% by weight.

7. A printed circuit board obtained by the method for manufacturing the printed circuit board according to claim 1.

* * * * *